United States Patent
Syracuse et al.

(10) Patent No.: US 8,280,652 B2
(45) Date of Patent: Oct. 2, 2012

(54) SENSOR, METHOD AND SYSTEM OF MONITORING TRANSMISSION LINES

(75) Inventors: Steven J. Syracuse, Charlotte, NC (US); Roy Clark, Thousand Oaks, CA (US); Peter G. Halverson, Temple City, CA (US); Frederick M. Tesche, Saluda, NC (US); Charles V. Barlow, Matthews, NC (US)

(73) Assignee: Promethean Devices LLC, Fort Mill, SC (US)

( * ) Notice: Subject to any disclaimer, the term of this patent is extended or adjusted under 35 U.S.C. 154(b) by 149 days.

(21) Appl. No.: 12/396,756

(22) Filed: Mar. 3, 2009

(65) Prior Publication Data

US 2009/0284249 A1    Nov. 19, 2009

Related U.S. Application Data

(63) Continuation of application No. PCT/US2007/077881, filed on Sep. 7, 2007.

(60) Provisional application No. 60/825,093, filed on Sep. 8, 2006.

(51) Int. Cl.
*G01R 15/00* (2006.01)
*H04B 15/00* (2006.01)

(52) U.S. Cl. ............... 702/57; 702/58; 702/59; 702/190

(58) Field of Classification Search ............... 702/57–60, 702/121–123, 179–190; 361/146–148
See application file for complete search history.

(56) References Cited

U.S. PATENT DOCUMENTS

| | | | |
|---|---|---|---|
| 6,714,000 B2 | 3/2004 | Staats | |
| 6,771,058 B2 | 8/2004 | Lapinksi et al. | |
| 6,956,364 B2 | 10/2005 | Staats | |
| 2002/0047709 A1 | 4/2002 | Fling | |
| 2005/0073295 A1 | 4/2005 | Hastings et al. | |
| 2005/0162148 A1 | 7/2005 | Staats | |
| 2005/0286190 A1 | 12/2005 | Rostron et al. | |
| 2007/0052493 A1 | 3/2007 | Lapinski et al. | |

OTHER PUBLICATIONS

International Search Report of counterpart foreign application PCT/US2007/077881; mailed Dec. 4, 2008; 2 pps.
Mamishev et al., "Effects of Conductor Sag or Spatial Distribution of Power Line Magnetic Fields," IEEE Trans. on Power Delivery, V. 11, No. 3, Jul. 1996.
Bush, et al, "Experimental Verification of a RT Program for the Determination of Temperature and Sag of OH Lines," IEEE Trans. Power App. & Systems, V. PAS102, No. 7., Jul. 1983.

(Continued)

*Primary Examiner* — Phuong Huynh
(74) *Attorney, Agent, or Firm* — Summa, Additon & Ashe, P.A.

(57) ABSTRACT

An apparatus, method, and system for measuring the magnetic field produced by phase conductors in multi-phase power lines. The magnetic field measurements are used to determine the current load on the conductors. The magnetic fields are sensed by coils placed sufficiently proximate the lines to measure the voltage induced in the coils by the field without touching the lines. The x and y components of the magnetic fields are used to calculate the conductor sag, and then the sag data, along with the field strength data, can be used to calculate the current load on the line and the phase of the current. The sag calculations of this invention are independent of line voltage and line current measurements. The system applies a computerized fitter routine to measured and sampled voltages on the coils to accurately determine the values of parameters associated with the overhead phase conductors.

27 Claims, 11 Drawing Sheets

OTHER PUBLICATIONS

Seppa, T.O., "Temperature-Sag Model for Operational Real Time Ratings," IEEE Trans. on Pwr. Delivery, V. 10, No. 3, Jul. 1995.

Chen, et al, "High Temp. Sag Model for OH Conductors," IEEE Trans. Pwr. Del., V. 18, No. 1, Jan. 2003.

Wait et al., "On the Image Representation of the Quasi-Static Fields of a Line Current Source above the Ground", Canadian Journal of Physics, vol. 47, 1969, pp. 2731-2733.

Olsen, "Electromagnetic Fields from Power Lines," Washington State University, Pullman, WA 99164-2752, 1993, IEEE Power Conference Proceedings.

PLOT OF TOTAL $B_y$ (vertical) FIELD COMPONENT ON THE EARTH AT 60 Hz FOR A SINGLE-PHASE 10.3 m HIGH LINE, AS A FUNCTION OF RANGE.

SENSOR, METHOD AND SYSTEM OF MONITORING TRANSMISSION LINES

CROSS-REFERENCE TO PRIOR APPLICATIONS

This application is a continuation of and claims the benefit of priority to co-pending International Patent Application No. PCT/US2007/077881 filed on Sep. 7, 2007, and published as WO 2008/031029. The international case, in turn, claims the benefit of priority to U.S. Provisional Patent Application Ser. No. 60/825,093 filed Sep. 8, 2006. The disclosures of both priority cases are hereby incorporated by reference in their entireties.

STATEMENT REGARDING FEDERALLY SPONSORED RESEARCH AND DEVELOPMENT

This invention was made with U.S. Government support under Contract No. DE-FG02-05ER84159 awarded by the Department of Energy. The government has certain rights in this invention.

FIELD OF THE INVENTION

This invention relates to a reliable, low cost, non-contact, non-invasive, high accuracy, high resolution sensor that will simultaneously monitor high voltage transmission conductor sag, temperature, maximum current-carrying capability (or "ampacity"), and phase current. Given this data, the system can estimate available transmission capacity ("ATC") and dynamically rate the circuit. The system of this invention performs extremely well with even a minimum number of installed sensors, and the system may be configured in either an entirely portable manner or installed for long-term use. The claimed computerized system and method make use of the magnetic field emanating from overhead transmission and distribution lines to determine the properties of the overhead phase conductors and the current thereon. The system takes advantage of the fact that the magnetic field from the phase conductors is more robust than the conductors' electric field. The electric field, or e⁻ field, is easily corrupted by weather and ground effects, so using the magnetic field provides a more stable system that can be used in multiple environments.

BACKGROUND

Demand for electric power has grown significantly faster than the transmission system's capability to deliver it, and deliver it reliably. As a result, the overhead transmission and power distribution system is being operated in a manner for which it was not designed; bottlenecks and congestion, blackouts, equipment damage, and system disturbances are becoming widespread, and are occurring with ever increasing frequency.

Real-time monitoring of critical, congested transmission circuits would improve reliability, relieve congestion, increase available transmission capacity ("ATC"), and safely allow more power to be moved over existing circuits than is presently possible. As a result, the existing system would serve more demand; operating revenues could be increased, and some demand-driven new construction and upgrade costs could be deferred. At the same time, system operational safety, reliability, and power transfer capability can be improved.

Existing real time ("RT") monitoring and dynamic thermal circuit rating ("DTCR") systems have significantly expensive total installed costs. As a result of the cost and other product issues, the market penetration, acceptance, use, and growth of these technologies have been impeded. The sensor of this invention will be far less expensive than existing sensor and DTCR technologies, will be capable of easy and rapid installation and calibration, and will enable widespread, low-cost implementation of DTCR.

The improvements necessary to relieving bottlenecks and congestion in transmission lines, while simultaneously maintaining reliability, have been studied thoroughly, reported in detail, and recommended time and again. At best it is a $50-100 billion, decades-long effort. While the required improvements are mostly understood, and have been detailed and charted, they are off to a very slow start. While a fraction of these improvements (including appreciable new construction) began in the late 1990's, and are underway today, the improvement rate is still very significantly lagging demand growth.

Congestion costs electricity consumers approximately four billion dollars per year. Congestion-related costs could be significantly decreased if, while maintaining reliability, increased transfers across congested overhead transmission paths were allowed. Increased transmission capacity would improve grid reliability by allowing regions to share capacity reserves. Real time-monitoring of congested circuit parameters is a focal point for efforts directed towards higher grid efficiency and reliability via improved measurement and grid visualization. Parameters include conductor sag, temperature, current, ampacity, and ATC ("available transmission capacity"). When these parameters can be determined accurately, and in real-time, latent or "hidden" transmission capacity can be revealed; this can then be monitored, quantified, logged, and modeled. Ultimately, and more importantly, such transmission capacity can be capitalized on via dynamic thermal circuit rating and operation. Real time dynamic thermal circuit rating ("RT-DTCR") systems maximize transmission circuit performance (ATC, ampacity, efficiency) while simultaneously maintaining reliability.

While a few commercial high voltage transmission line ("HVTL") sensors and DTCR systems have become available over the years, acceptance, market penetration, use, and growth-in-use have been impeded by a number of factors. Technical issues (e.g., system failure, sensor impacts on reliability, poor accuracy, frequent loss of calibration, complex/lengthy/invasive installation or calibration) have plagued some technologies. More important has been the very high total installed cost. An overhead transmission line (OHTL) sensor/DTCR product with drastically lower costs would represent a dramatic improvement over existing commercial technologies.

Efforts to develop devices aimed at measuring conductor capacity, usage, and availability are hindered by complexity in design or installation. Genscape, Inc., for example, has filed multiple patent applications for their method of monitoring power and current flow in phase conductors. Several of the Genscape, Inc. publications (e.g., U.S. Pat. No. 6,714,000; U.S. Pat. No. 6,771,058; U.S. Pat. No. 6,956,364; and U.S. Patent Application No. 20050162148) require magnetic field measurements and electric field measurements to derive electrical power dynamics in the facility. Genscape's dual measurements entail significantly intricate data processing to estimate the power flow (MW) in high voltage transmission circuits.

Genscape's U.S. Patent Application 20070052493 utilizes magnetic flux measurements to determine which position below an overhead conductor is optimal for detecting changes in magnetic field. The '493 publication gives little detail regarding the manner by which the data gathered by the process therein could be used to determine additional useful parameters such as phase conductor magnitude, phase angle, cable heights, temperature, and ampacity.

U.S. Patent Application 20050286190 to Rostron discloses an electric power monitoring system using electromagnetic field sensors located remotely from the phase conductors. Rostron does not disclose the mathematical bases and algorithms for unknown system variables. At best, Rostron discloses the idea that measuring the electromagnetic field from a fixed, above-ground pedestal or platform can be used in predicting phase currents. Rostron offers little more detail.

BRIEF SUMMARY OF THE INVENTION

The invention herein includes an apparatus, a computerized method, and a computer-implemented system for measuring the magnetic field produced by phase conductors and using those measurements to determine the amplitude, phase and current on a phase conductor, as well as that conductor's position in space (sag). The method requires neither conductor temperature nor electric field measurements for accuracy. These values, in addition to known standards for the materials within the power distribution system, allow for calculating current amplitude and phase, in addition to line sag, with remotely placed sensor measurements. Upon calculating line current and sag, the conductor temperature and capacity, along with ampacity, may be determined.

The objects of this invention are accomplished by using a sensor for measuring the three dimensional phase and magnitude of the magnetic field emanating from phase conductors in an overhead transmission system. The sensor takes advantage of at least two parallel wire coils having opposite polarity currents generated by the magnetic field. The coils, also called windings herein, cancel the electric field and the noise associated therewith for better accuracy.

The sensors are used in pairs to measure the x and y components of the magnetic field from an overhead power transmission and distribution line. These magnetic field components induce respective open circuit voltages on each sensor, which serve as inputs to a larger computerized system for calculating other parameters of interest in the model.

The system disclosed and claimed herein also implements a computerized method of measuring the physical height of three or more phase conductors in a power transmission and distribution system. In particular, the system's data acquisition and data analysis modules efficiently fit compared data measurements with known operating parameters to determine, at a minimum, the height of a phase conductor, as well as the magnitude and phase of the current on that conductor. Other parameters, such as sag, ampacity, capacity, and frequency of the current, along with conductor temperature, can also be determined from the system disclosed and claimed below.

DETAILED DESCRIPTION

High voltage overhead phase conductors are very long, gentle catenaries, the electro-mechanical characteristics and behavior of which have been intensely studied are very well understood[1]. The quasi-lineal phase conductors generate time-varying magnetic fields that, at 60 Hz, may be treated quasi-statically. The field strength at any location can be measured very accurately and, if measured simultaneously at multiple, spatially distinct locations, used to determine accurately the distance to the conductors. The distance, in turn, can be used to determine the sag of the conductors; given this, the average conductor temperature, current phase angle, and magnitude of the current can be accurately established.

The magnetic field, H, around a phase conductor has magnitude, $H=I/2\pi r$, where r is the distance to the conductor and I is the phase current. In three-phase transmission circuits, the phase currents, $I_1$, $I_2$ and $I_3$, are 120 degrees out of phase, vary widely over the course of a day. In realistic systems, there will be imbalances that are addressed in the work supporting this invention. While the basics physics discussed below predominantly address a balanced system, the invention encompasses the multitude of imbalanced parameters that could be present in any given situation.

$H_1$, $H_2$ and $H_3$ continuously vary in strength and flip directions at the fundamental frequency (e.g., 60 Hz in the U.S. and 50 Hz in Europ). To determine the combined H field at any location, one must compute the vector sum of the three contributing fields by decomposing them into horizontal (x) and vertical (y) components and adding these separately. This sum is noted as $H_x=H_{1x}+H_{2x}+H_{3x}$ and $H_x=H_{1x}+H_{2x}+H_{3x}$. One should note that only the x and y components of the magnetic field are significant for purposes herein because the third, the z component, is so small that it is statistically insignificant for the system here.

Figure 2:
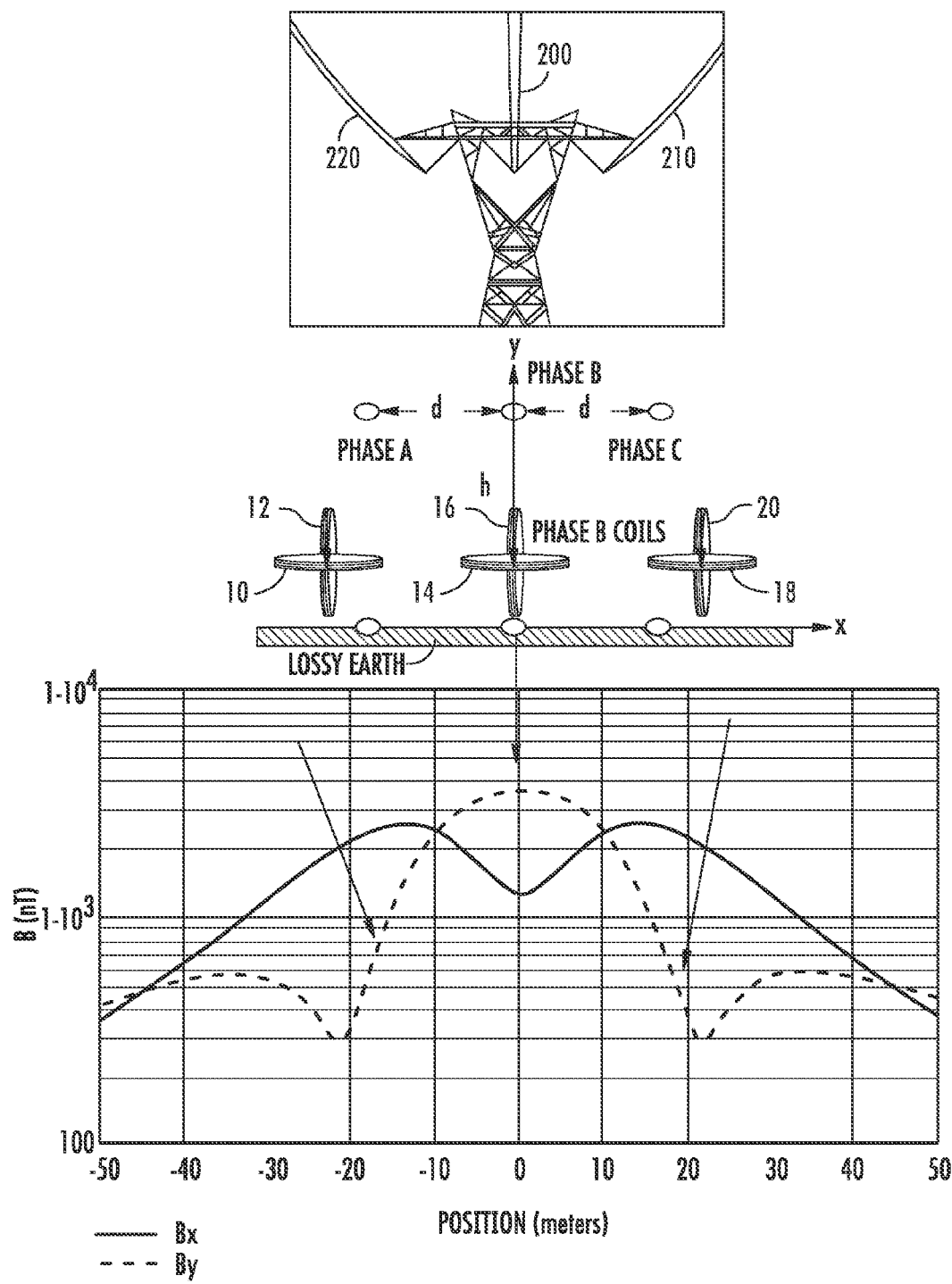
FIG. 2 shows a three-part representation of the sensors as placed under a horizontally-oriented 3-phase overhead power line and the associated output generated by the system.

For a circuit with a horizontal phase conductor configuration, such as that of FIG. 2, $H_{1x}$ and $H_{1y}$, at a point directly under the nadir of the central phase conductor 200, are given by $$H_{1x} = \frac{I_1}{2\pi}\left(\frac{h}{h^2+d^2}\right), \text{ and } H_{1y} = \frac{I_1}{2\pi}\left(\frac{d}{h^2+d^2}\right).$$

(Equation 1.1), where d is the fixed distance distance between the phase conductors 200, 210, and 220, and h is the height of the conductors above the test point, $$H_{2x} = \frac{I_2}{2\pi}\left(\frac{1}{h}\right), H_{2y} = 0, \text{ and } H_{3x} = \frac{I_3}{2\pi}\left(\frac{h}{h^2+d^2}\right),$$

$$H_{3y} = \frac{I_3}{2\pi}\left(\frac{-d}{h^2+d^2}\right).$$

(Equations 1.2 and 1.3)

Since $I_1$, $I_2$ and $I_3$ are sinusoids, the system must sum three, 120 degree out-of-phase, sinusoidal, scalar quantities. Consider three scalar quantities, $V_1$, $V_2$ and $V_3$, sinusoidally varying, and 120 degrees out-of-phase. In phasor notation, $V_1$, $V_2$, and $V_3$ may be expressed as $V_1 = V_{1p}[\cos(0)+j\sin(0)] = V_{1p}$, $V_2 = V_{2p}[\cos(120)+j\sin(120)] = V_{2p}[-½+j\sqrt{3/4}]$, and $V_3 = V_{3p}[\cos(-120)+j\sin(-120)] = V_{3p}[-½-j\sqrt{3/4}]$, where $V_{1p}$ is $V_{1peak}$, $V_{2p}$ is $V_{2peak}$, etc. The magnitude of the combined quantities is given by $$V = [(\text{real part})^2 + (\text{imaginary part})^2]^{1/2}$$
$$= \left[\left(V_{1p} - \frac{1}{2}V_{2p} - \frac{1}{2}V_{3p}\right)^2 + \left(\sqrt{\frac{3}{4}}V_{2p} - \sqrt{\frac{3}{4}}V_{3p}\right)^2\right]^{1/2}$$
$$= [V_{1p}^2 + V_{2p}^2 + V_{3p}^2 - (V_{1p}V_{2p} + V_{1p}V_{3p} + V_{1p}V_{3p})]^{1/2}$$

Dropping the "p" subscript, the result is $$V = [(V_1^2 + V_2^2 + V_3^2 - (V_1V_2 + V_1V_3 + V_1V_3)]^{1/2}. \quad \text{(Equation 2)}$$

For a test location directly under the nadir of the center phase, the system combines the field components from the three overhead phases. By inserting the x component of equations 1.1, 1.2, and 1.3 into Equation 2, we find that the magnitude of $H_x$, the horizontal field component, is $$H_x = [H_{1x}^2 + H_{2x}^2 + H_{3x}^2 - (H_{1x}H_{2x} + H_{1x}H_{3x} + H_{2x}H_{3x})]^{1/2} \quad \text{(Equation 3x)}$$
$$= \frac{I_1\sqrt{3}\,d}{2\pi h^2 + d^2}$$

Similarly, for $H_y$, the vertical field component, we have $$H_y = \frac{I_1}{2\pi}\left(\frac{1}{h} - \frac{h}{h^2+d^2}\right).$$

(Equation 3y) The ratio of the components is $$\frac{H_y}{H_x} = \frac{\sqrt{3}\,h}{d}. \quad \text{(Equation 4)}$$

It is important to note that when the load on the conductor is balanced, Equation 4 is independent of both the circuit voltage and the current in the phase conductors. For an AC transmission circuit with horizontal phase conductor geometry, Equation 4 shows that by simultaneously measuring the AC amplitude of $H_x$ and $H_y$ directly below the central phase conductor, the distance from the phase conductors to the sensing coils can be determined using the formula $$h = \frac{d}{\sqrt{3}}\frac{H_y}{H_x},$$

(Equation 5), where d is the fixed separation of the phase conductors. Given h, we can then calculate the phase current, I, from Equation 3y, $$I = 2\pi H_y\left(\frac{1}{h} - \frac{h}{h^2+d^2}\right)^{-1}.$$

$H_x$ and $H_y$ can be determined by measuring the AC voltages developed in large area coils positioned within the magnetic field of at least one phase conductor. One can use the coils to measure the magnitude and phase of the magnetic fields in three dimensions (i.e., the "x" or left/right dimension, "y" or up/down dimension, and "z" or forwards/backwards dimension). In this embodiment, the three dimensional picture of the fields can be described as vectors whose tails are fixed at points in space, but whose tips rotate at, for example, 60 Hz tracing out ellipses as they rotate. As will be explained in more detail below, one preferred embodiment of the system of this invention utilizes only the coils whose axes are in the horizontal and vertical directions.

Figure 6:
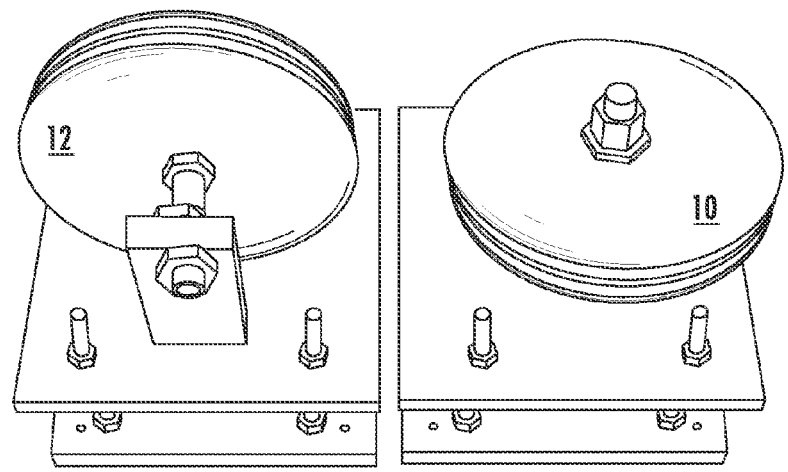
FIG. 6 shows a pair of electric field canceling magnetic field sensors for placing under an overhead transmission line according this invention.
Figure 7:
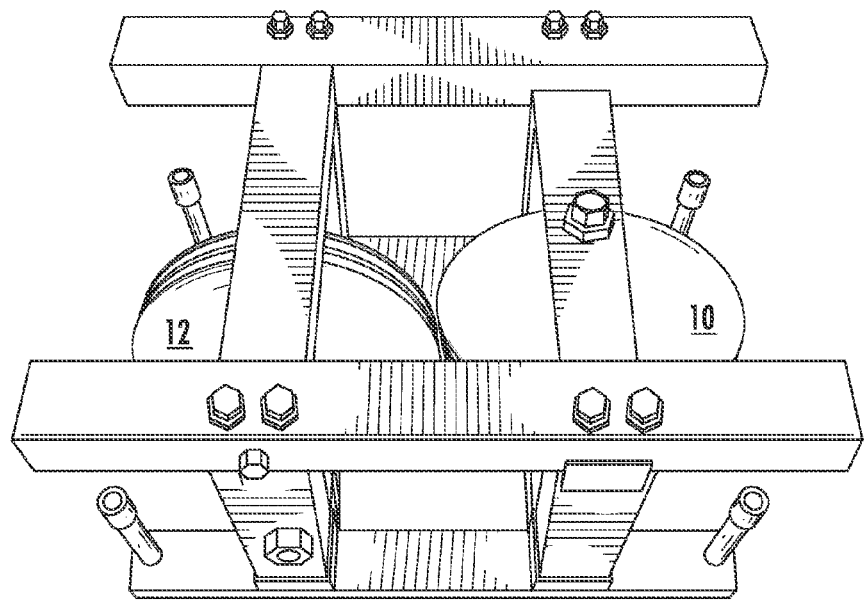
FIG. 7 shows the sensor pair of FIG. 6 with a protective housing for long term installations.

Given H, the RMS voltage V for a coil whose n turns enclose an area A is $V = 2\pi F \mu_0 H n A$. F is 60 Hz, $\mu_0 = 4\pi \times 10^{-7}$ Henries/meter, and H is the RMS amplitude of the component of the magnetic field in the direction of the coil axis. To measure $H_x$, a coil 12, such as that shown in FIG. 6, whose axis is horizontal is used; $H_y$ requires a coil 10 with a vertical axis. Two identical coils (FIG. 6) with orthogonal axes (a "T" configuration) may be used to continuously monitor $H_y/H_x$, giving us continuous information on h and $I_{rms}$.

While Equation 5 applies only to the horizontal phase conductor configuration, vertical phase conductor configurations (FIG. 3) can also be monitored with properly configured coils (10, 12, 14, 16, 18, 20). In this case, $H_y$ directly under the phases will be zero (by symmetry), so the $H_y/H_x$ approach cannot be used. However, $H_x$ can be measured simultaneously at two heights, $y_1$ and $y_2$, directly under the conductors 310, 320 and very close to ground level; the ratio $H_x(y_1)/H_x(y_2)$ can be then used to determine h and, given this, $I_{rms}$. The layout and functional block diagram for the field development system is shown in FIG. 1.

Figure 1:
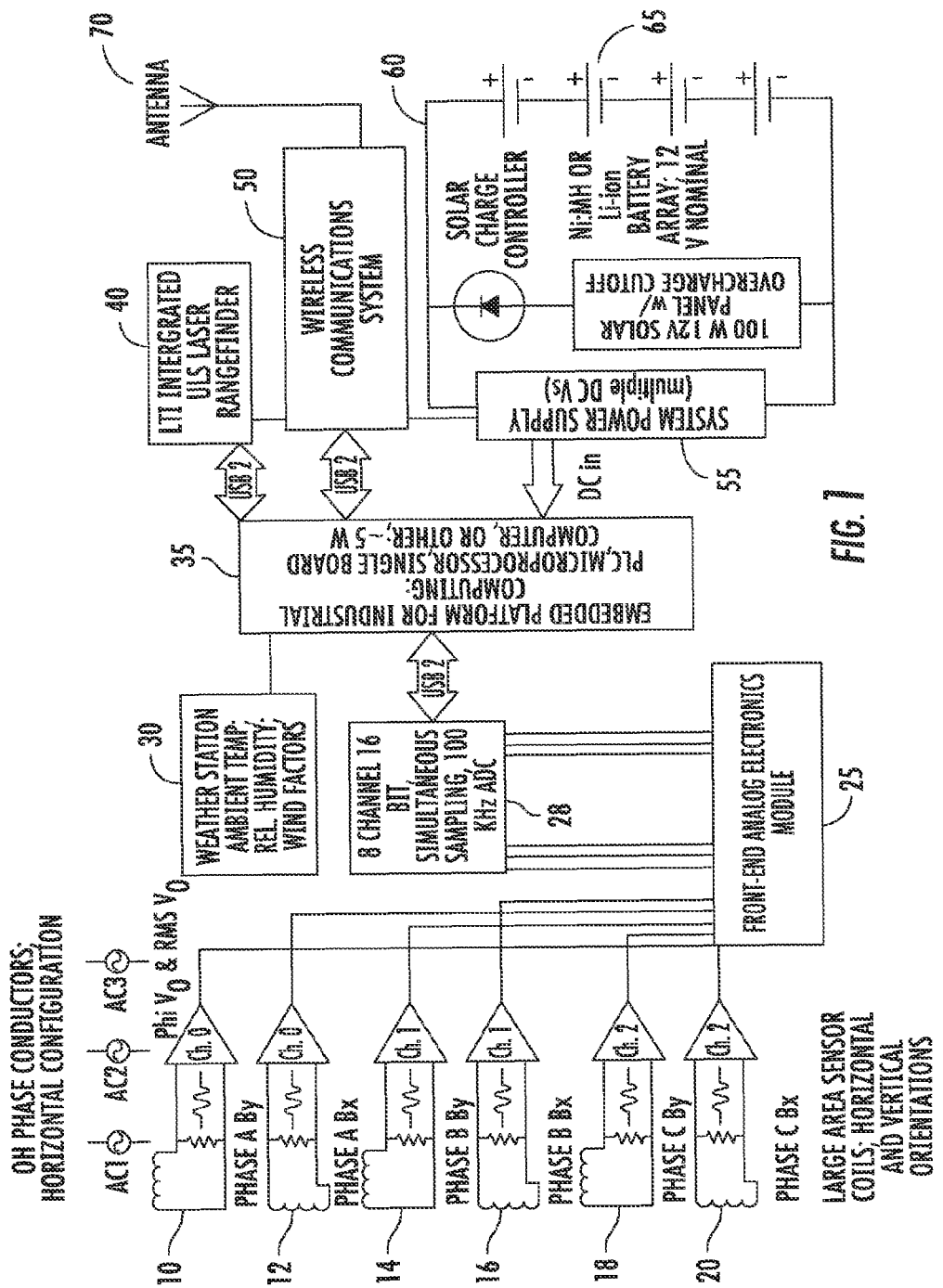
FIG. 1 schematically depicts the electronic circuit of this invention as installed in a field operation having magnetic field sensors under overhead phase conductors.

As set forth in FIGS. 1 and 2, one embodiment of this invention includes two large area coils 14, 16 (650-1000 m²) located directly under the nadir of the central phase conductor 200 of a horizontally configured transmission circuit. The coils 14, 16 are arranged in a "T" configuration, and are located at ground level, or just above. The coils and sensor system occupy a volume of about 1 m³, sit on a thin concrete pad, and are housed within a high reliability, high strength weatherproof enclosure (non-metallic; low μ). Calculations further indicate that, at minimal additional cost, the sensor system can be located just beneath the surface of the earth with the solar panel and antenna being located on the nearest transmission tower.

The thermo-mechanical relationship between phase conductor sag and average conductor temperature has been studied exhaustively and modeled extensively[2, 3, 4]. Several commercial software packages, e.g., Sag10, LineAmps, EPRI's DTCR Package, and The Valley Group's IntelliCat, are based on prior models. Given mechanical, engineering, and dimensional information specific to the span and conductor being monitored (e.g., line tension, conductor type and properties, span length), the average temperature of the conductors in the span can be determined from accurate, real-time sag measurement. Combining $I_{rms}$ with accurate knowledge of sag and temperature, and incorporating the conductor's static rating (the latter a function of temperature), allows us to calculate ampacity. The difference between the actual, real-time ampacity and actual, real-time conductor $I_{rms}$ is a measure of the margin, or additional transfer capability, available to operators, if the monitored spans are not clearance (sag) limited and/or thermally limited. This is the basis for dynamic thermal circuit rating ("DTCR") and operation.

Referring to FIG. 1, the preliminary design of the Sensor System supports very low continuous power requirements. Subsystems and components support low duty-cycle operation via sleep, quiescent, and on-off operational modes. The transducers themselves require no power, and for most embodiments, no system component or subsystem requires active (TEC-based) heating or cooling. The system will be powered by the combination of a high efficiency 12 V Si solar panel 60 and a rechargeable Ni:MH (or Li ion) battery array 65; these will feed a Switched Power Supply 55. The two most power intensive system components are the single board computer 35 and the wireless communications transmitter 50, at 5 W and approximately 4 W, respectively. Maximum continuous power consumption is less than 9 W. The combination of the solar panel 60 and the, high-efficiency battery array 65 will supply system power under all conditions. In darkness, the fully charged battery array 65 can power the system for more than 60 hrs.; recharge time in full sunlight is less than or equal to 7 hours. Given the thermo-mechanical time constants of overhead phase conductors, active reporting at 7.5 or 10 minute intervals should be entirely sufficient to support all end-user monitoring and/or DTCR activities. At 7.5 minute reporting, the effective system power duty cycle will be approximately 6.7%.

Technical discussions of DTCR technology always treat the parameters to be monitored, and the sensor types, but always speculate as to the number, location, and spacing of same. It is well known that the location, route, direction, elevation, and topography of a circuit, and its right of way, have very significant effects on the temperature and, therefore, the sag and clearance of overhead high voltage conductor spans. If, for example, one has 5, 10, 20, or perhaps more, straight rights of way or circuit miles on level ground, and with a single compass direction, it is plausible that a single sensor, located on the ruling span (or a critical span) could provide the desired real time ampacity-limiting sag and temperature information. However, long, straight, transmission rights of way, over single types of terrain and vegetation, and at constant altitude, do not represent a significant fraction of rights of way and circuit miles in the United States.

Most commonly, there are numerous changes in direction, topography, and elevation along a given circuit; such changes affect incident solar radiation, wind velocity, wind direction, ambient temperature and humidity. Changing topography, surface vegetation, and surface/terrain geology have a significant influence on conductor temperature and, therefore, sag; such changes can frequently be observed on a span by span basis. These factors combine to render conductor temperature and sag highly dynamic and unpredictable. While weather systems, patterns, and ambient conditions may be very similar within 5, 10, or 20 miles, in many cases, even assuming static right of way parameters, over the time course of minutes to hours one sees significantly different ambient temperatures, humidity, wind velocity/direction at points separated by such distances.

Ruling spans are obviously initial, or default, sensor locations.[5] However, the ruling span is an assumed uniform design span which approximately portrays the thermo-mechanical behavior of a span between its dead ends. Its purpose lies with the design and construction of a line (sags and clearances are calculated for structure spotting and conductor stringing), not with operation over the seasons and the years. Additionally, while a ruling span is a logical starting point, its thermo-mechanical state and behavior may not at all be representative of the circuit as a whole.

In response to aging infrastructure, significant increases in average loading, and the growing problem of congestion, many utilities, independent service operators ("ISOs"), and regional transmission organizations ("RTOs") now have high-accuracy survey data on their transmission lines and rights of way. Many recent surveys have focused on known, heavily loaded and congested paths, and have revealed the existence of so-called "critical spans," i.e., spans that are not infrequently sag/clearance limited. Such critical spans are obvious candidates for sensor placements. With such survey data in hand, it is typically possible to assign a single, most critical span, but there are frequently additional spans that are, statistically, also critical. As a result, a given congested (or heavily loaded) path may contain a dozen or more critical spans that are, or could be, indicated for sensor placement.

The fact of the matter is that presently there is no clear rule or consensus as to sensor number and spacing. Each utility, RTO, and ISO is different, each congested path is unique, and 'critical span,' insofar as using the term to designate a sensor placement, is, for a number of reasons (some of which are statistical), defined differently by different entities. It is virtually certain that the determination of sensor number, location, and spacing will be made on a case-by-case basis, viz. RTO by RTO, congested path by congested path. If the history of the purchase of Intelligent Electronic Devices ("IEDs") for transmission and distribution ("T&D") system applications is any guide, then it is also virtually certain that the number of sensors specified will be inversely proportional to total installed cost.[6]

As more current flows in an electrical power line, the $I^2R$ loss in the conductors causes an increase in the line temperature, with a corresponding lengthening of the line conductors due to thermal expansion. Since the conductors are supported at fixed points (e.g., at the towers), there will be a change in the conductor height as the current increases, and this change in conductor height causes a small change in the B-field as measured at ground level.

Using a simple three conductor model for a three-phase power transmission line, calculations have been performed to illustrate the behavior of the vertical and horizontal components of the B-field on the earth under the line. This model is based on an approximate solution for the fields, which uses a complex image theory to include the effects of the lossy earth under the line. It turns out, however, that for field observation points close to the transmission line, the earth effects are negligible.

Line Geometry and Current

Figure 3A:
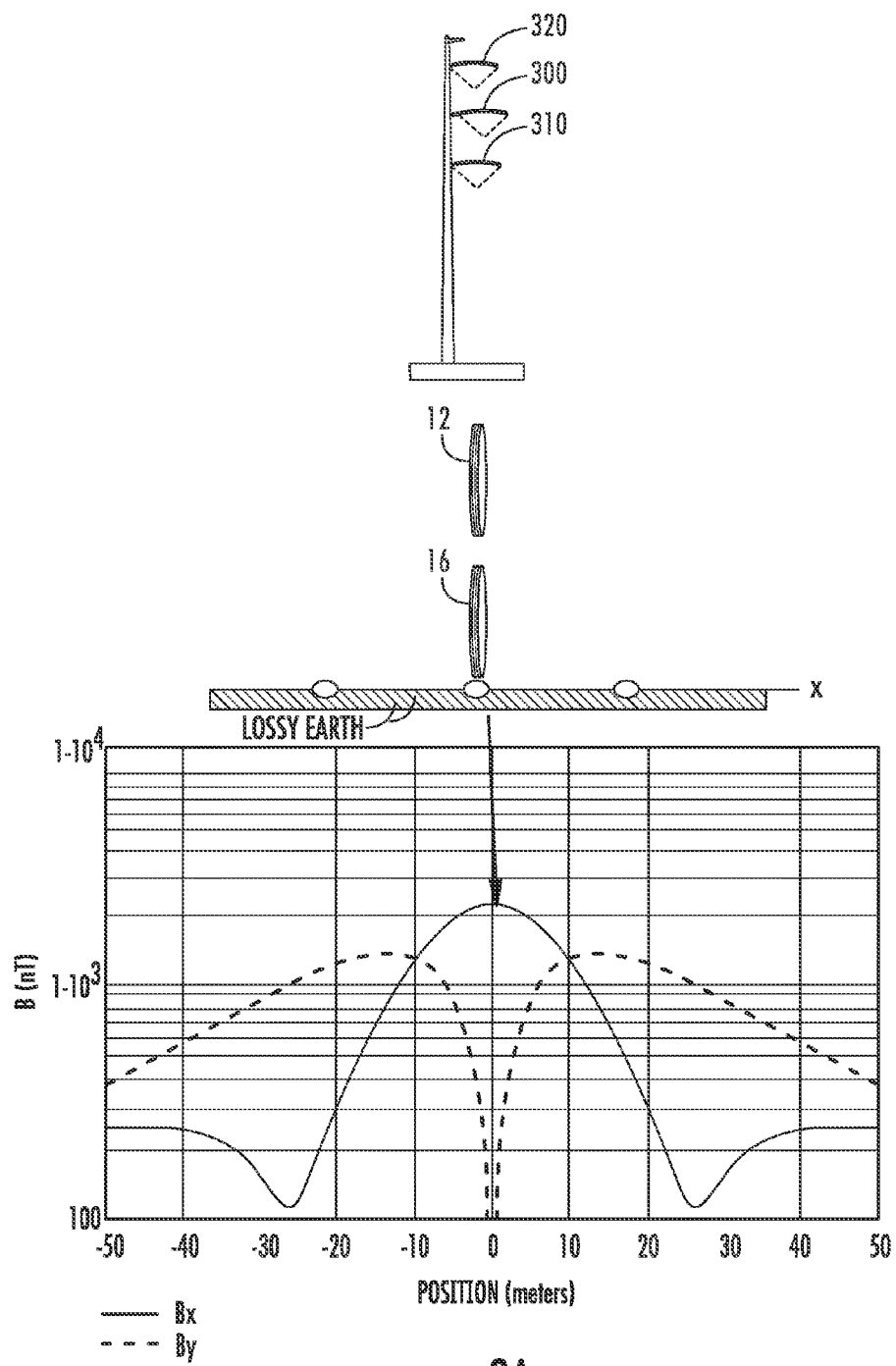
FIGS. 3A and 3B show a three-part representation of the sensors as placed under a vertically-oriented 3-phase overhead power line and the associated output generated by the system.
Figure 3B:
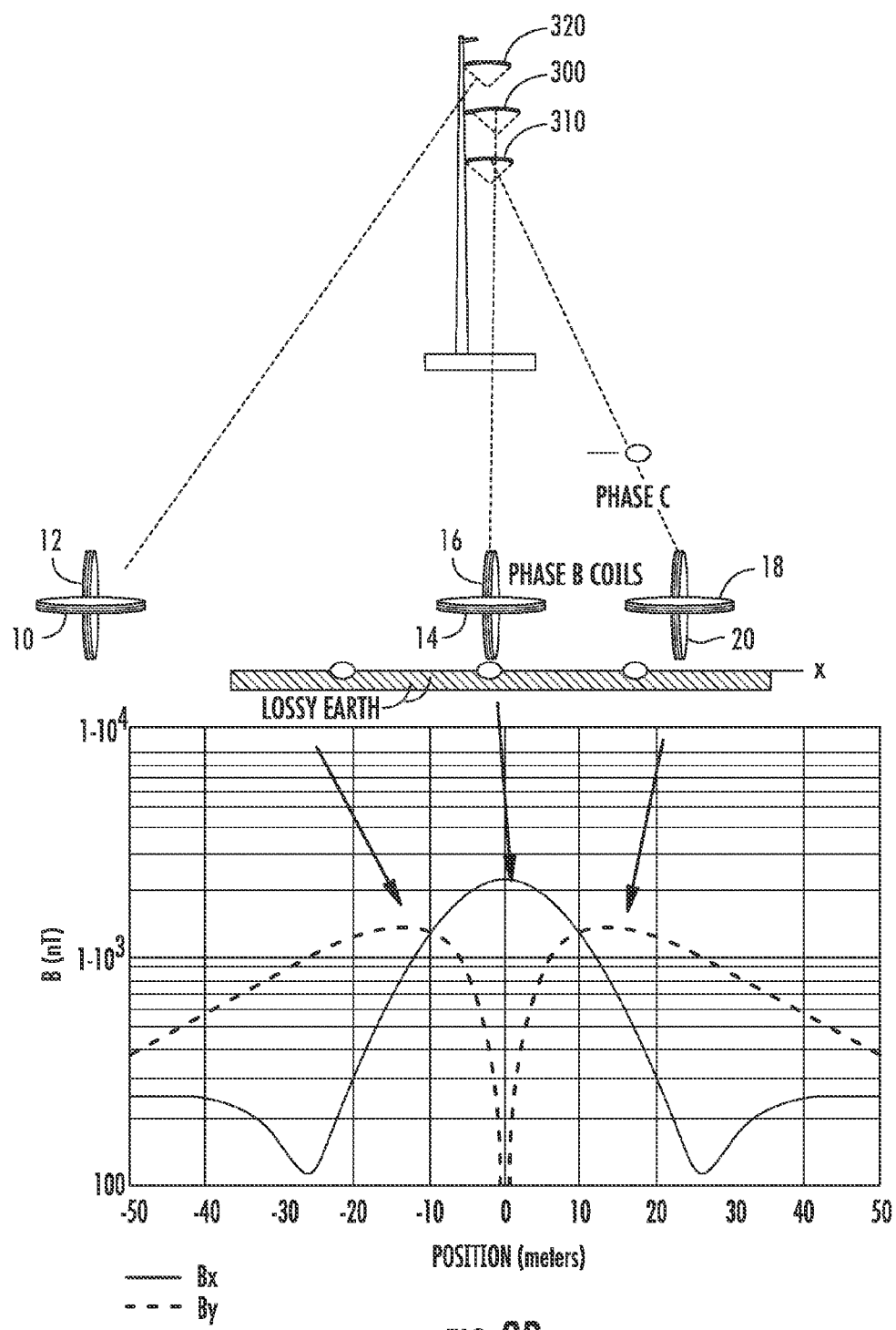

This study utilizes two configurations that are typical of 500 kV-class transmission lines as shown in FIGS. 2 and 3. As shown in FIG. 2, one line has a horizontal layout of the phase conductors 200, 210, 220, and there may be two shield conductors mounted symmetrically above the phase conductors (not shown). FIG. 3 portrays a vertically stacked line with a single overhead shield wire and three phase conductors 300, 310, 320.

This analysis neglects the overhead shield conductors and any current that may be flowing in them. In the horizontal configuration of FIG. 2, a typical line height is h=17.4 m and the phase conductor separations are d=10.67 m. For the vertical conductor configuration of FIG. 3, the phase A conductor height is taken to be h=17.4 m and the phase conductor separations are d=9.14 m.

The voltages on the lines of FIG. 2 are 120° out of phase with each other. Taking the 0° phase reference to be on the Phase B conductors, the line voltages can be expressed in phasor notation as $$\left. \begin{array}{l} V_A = V_O e^{-j2\pi/3} \\ V_B = V_O e \\ V_C = V_O e^{+j2\pi/3} \end{array} \right\}. \tag{1}$$

Note that these voltages are balanced, in that their sum is zero:

$$\sum_i V_i = 0.$$

The currents that flow in the lines depend on the electrical loads attached to the line. Utilities attempt to balance these loads so that the line currents are also balanced. However, this is not always possible and sometimes there will be a total, or zero-sequence, current $I_o$ flowing, as $$\sum_i I_i = I_o. \tag{2}$$

Moreover, because the electrical loads on the line may be reactive, there is no guarantee that the currents have the same phase as the voltage, nor are the phases exactly 120° apart. As time varies, both the amplitudes and relative phases of the current phasors can be expected to change, depending on the state of the electrical loading of the line.

If we assume that the current phases are identical with the voltage phases, then the zero sequence current can be written as $$\begin{aligned} I_O &= I_A e^{-j2\pi/3} + I_B + I_C e^{+j2\pi/3} \\ &= \sqrt{I_A^2 + I_B^2 + I_C^2 - I_A I_B - I_A I_C - I_B I_C} \end{aligned}. \tag{3}$$

Estimation of Magnetic Flux Density

To compute the B-field produced by an overhead power line, the starting point is to use the Biot-Savart law[7], which provides the magnetic (H) field in the vicinity of a conductor carrying a quasi-static current I. For a theoretically infinite straight line conductor, the Bior Savart law reduces to Amperes Law: The H-field at a distance r from the wire produced by the current is in the $\hat{\phi}$ direction, and is expressed as $$H_\phi(r) = \frac{I}{2\pi r} \text{ (A/m)}. \tag{4}$$

The corresponding magnetic flux density (B-field) around the wire is given by $$\vec{B} = \mu_0 \vec{H},$$

where $\mu_o = 4\pi \times 10^{-7}$ (H/m). Thus, the B-field is $$\begin{aligned} B_\phi(r) &= \frac{\mu_o I}{2\pi r} \text{ (teslas)} \\ &= 200 \frac{I}{r} \text{ (nanoteslas)} \end{aligned} \tag{5}$$

By Lenz's law, the open-circuit voltage induced in an n turn wire coil with area A is related to the time derivative of the B-field linking the coil by $$V(t) = -nA \frac{dB}{dt} \text{ (volts).} \tag{6}$$

For a time harmonic B-field with frequency f, the peak amplitude of the induced open circuit coil voltage is given as $$|V(f)| = 2\pi f n A B \text{(volts).} \tag{7}$$

The simple relationship between the B-field and the open circuit voltage of the loop in Eq. (7) implies that such a loop can be used as a sensor to measure the B-field produced by an overhead power line. Accordingly, a power line can be modeled as three overhead conductors at locations $(x_i, y_i)$ over a conducting earth. For each conductor in the line, the B-field at an observation location $(x_o, y_o)$ can be expressed in terms of a direct contribution in the form of Eq. (4) plus a contribution arising from the presence of the lossy earth. Expressions for the B-field from a single conductor over the earth have been developed by Wait[8] and later used by Olsen[9] for a three phase line like that in FIG. 2.

From Olsen the Cartesian components of the B-field at location $(x_o, y_o)$ are given by a sum of three terms arising from the currents in each conductor as $$B_x(x_O, y_O) = -200 \sum_{i=1}^{3} I_i \left[ \frac{(y_o - y_i)}{r1_i^2} - \frac{(y_o + y_i + \alpha)}{r2_i^2} \right] \text{ (nT)} \tag{8a}$$

$$B_y(x_O, y_O) = 200 \sum_{i=1}^{3} I_i \left[ \frac{(x_o - x_i)}{r1_i^2} - \frac{(x_o - x_i)}{r2_i^2} \right] \text{ (nT).} \tag{8b}$$

In the above expressions, the first term in the bracket is the direct B-field contribution from the wire, and the second term arises from the earth effect. This second term appears as an image of the overhead conductor in the earth at a complex distance $(y+\alpha)$, where y is the height of the conductor in question, and $\alpha$ is a frequency dependent complex distance given by $$\alpha = (1+j)503\sqrt{\frac{1}{\sigma_g f_o}} \quad (m). \tag{9}$$

The terms r1 and r2 are the distances from the wire and image to the observation point, respectively, and are given as $$r1_i = \sqrt{(x_o - x_i)^2 + (y_o - y_i)^2} \quad (m) \tag{10a}$$

$$r1_i = \sqrt{(x_o - x_i)^2 + (y_o + y_i + \alpha)^2} \quad (m) \tag{10b}$$

Effect of the Earth on the B-Field

Figure 8:
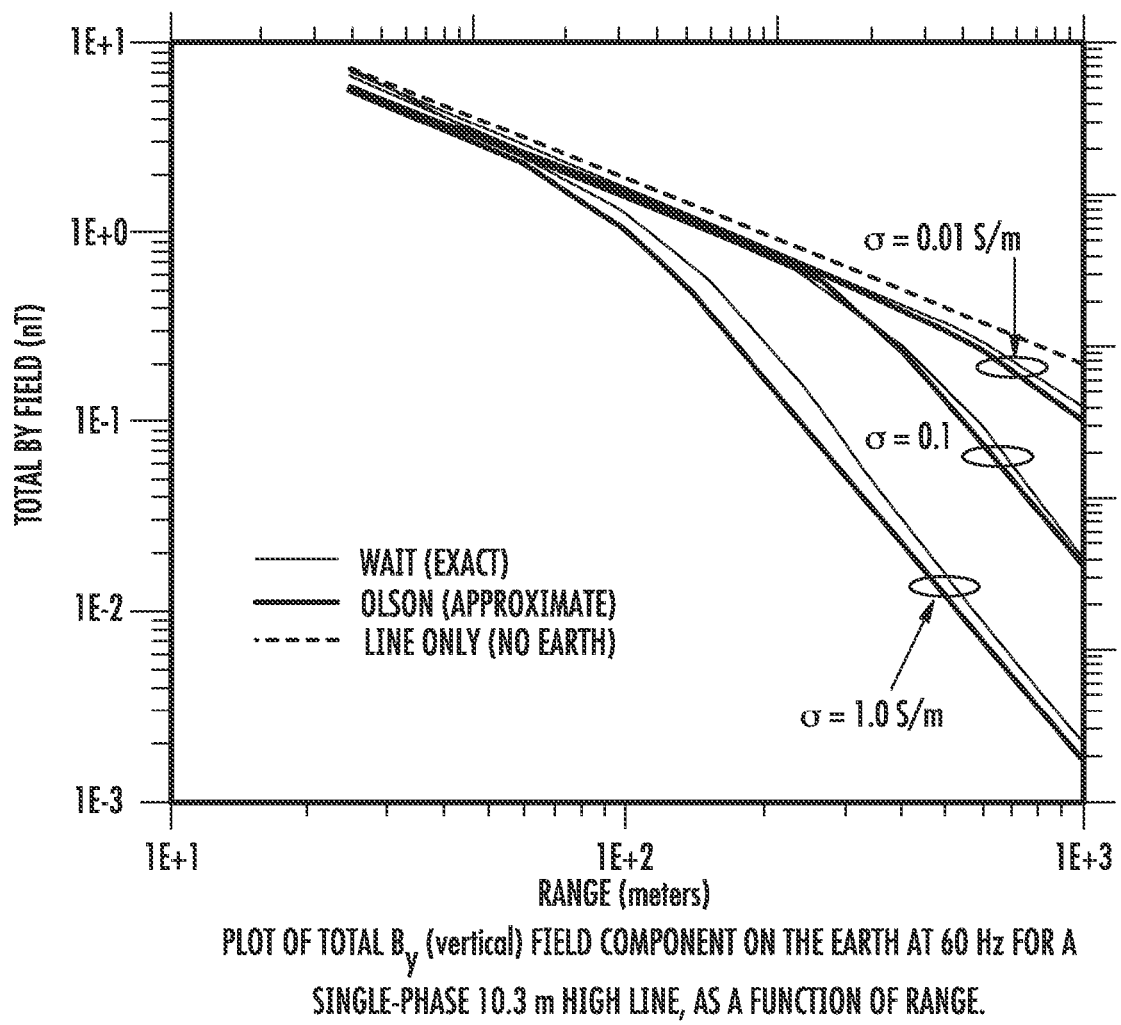
FIG. 8 is a plot of the vertical field component of the image magnetic field that would be measured on the ground/earth level as generated by an overhead transmission line.

To illustrate the behavior of the B-field produced by an overhead power line and assess the effects of the conducting earth, it is instructive to consider a single conductor line (e.g., a line like that in FIG. 2 with current flowing only in phase B 200. For a 10.3 m high line, FIG. 8 presents a plot of normalized vertical B field (By/I) at 60 Hz for different earth conductivities, using the rigorous analysis of Wait and the approximate image analysis by Olsen. The x-axis of this plot represents the horizontal distance of the observation point from the line, and close to the line, it is noted that the complex image and exact models agree well, and that the earth effects are not very significant.

A real earth has an electrical conductivity σ that lies between 0.1 and 0.0001 S/m. From FIG. 9, we note that for this range of conductivity, the B-field response for observation points less than 200 meters from the line is very nearly equal to that of the isolated phase conductor. Thus, close to the line, the earth effects are negligible and the second term in the brackets in Eq. (8) can be omitted. The B-field is calculated by just the contributions from the phase conductor currents.

Analysis of FIGS. 2 and 3

It is instructional to plot the B-field under the 3-conductor line of FIG. 2. FIG. 2 includes a magnetic field plot for the 3-conductor line with the 3-phase current having 120° phase differences and 400 A amplitude. The vertical (y) component of the B-field is a maximum under the center phase (200), and the horizontal (x) component is maximized at about x=±14 meters, which is close to the horizontal locations of the outer (210 and 220) phase conductors. It is notable in FIG. 2 that the maximum B-field amplitude is about a factor of 3 smaller than in the 3-conductor case with the same current magnitudes and identical phases. It is interesting to consider the behavior of the B-fields on the ground under the alternate line, shown in FIG. 3, which has the conductors stacked vertically. FIG. 3 shows the vertical and horizontal B-field components under this line, and one should note that the behavior of these components are reversed from that of the line with horizontal conductors. That is to say that for the line with vertically stacked conductors 300, 310, 320, the horizontal (x) component of the B-field is maximum under the line, and the vertical (y) fields are maximized at x=±14 meters.

Effects of Zero-Sequence Current

To assess the importance of the presence of a zero-sequence current flowing in the transmission line of FIG. 2, the computational model has been used with the phase currents A and C equal to 1300 A, which is near the maximum. The phase B 200 current is equal to 1300+$I_o$, where the zero sequence current $I_o$ is allowed to vary from 0 to 100 A. Each of these currents has a 120° phase difference from the others.

The peak values of the B-fields (magnetic flux density fields) are relatively insensitive to the presence of the zero-sequence current. By placing magnetic flux density sensors at these peak field locations, the system will provide useful data for estimating line sag. In this regard, the first placement of the sensors does not have to be arbitrary, but instead, the system will approximate the most sensitive locations to place the sensors for accuracy.

Estimates of Line Sag

With the computational model for the B-fields, it is possible to examine and evaluate various strategies for estimating transmission line sag due to line heating. Some of these strategies require further study, but a first step in developing a method for estimating line sag it to examine how the measured B-fields on the earth change as the line height varies.

Figure 10:
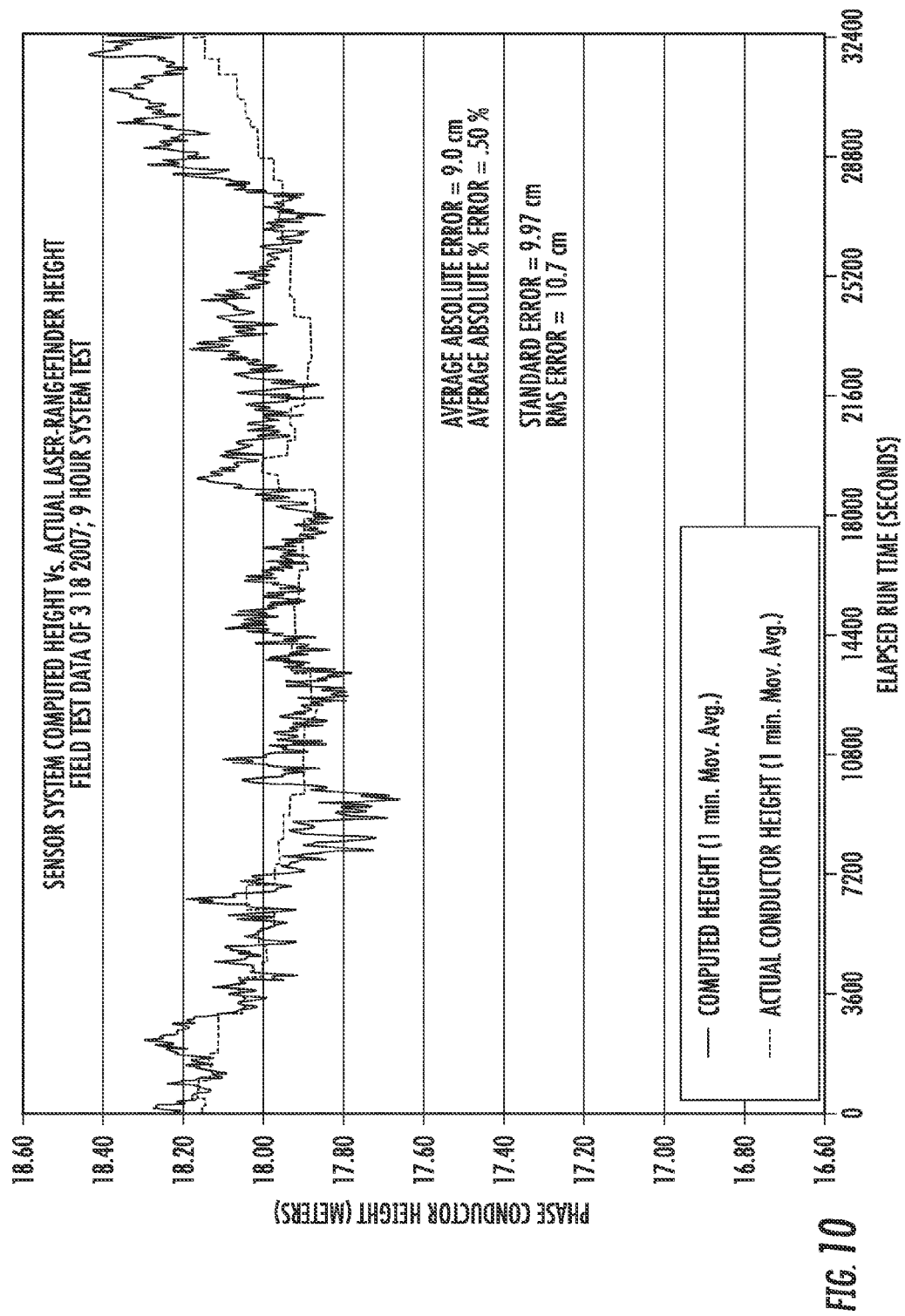
FIG. 10 is a plot of the sensor system computed height in comparison to the known value as measured.

Also, in the system of this invention, the value of line height is calculated quite accurately, as shown in FIG. 10, to address issues related to line sag.

Computerized Method of Analyzing Overhead Transmission and Distribution Lines Against the back drop of the above discussions, one should note that it is within the scope of this invention to use computerized systems to implement the computations for determining the current magnitude, current phase and phase conductor height for any given overhead power transmission and distribution system. These parameters can then be used to model other factors such as line temperature, sag, clearance, ampacity, and line capacity. As shown in FIGS. 1-3, the computerized system of this invention utilizes orthogonally oriented pairs of electric field canceling magnetic field sensors 10, 12, 14, 16, 18, and 20 placed under overhead phase conductors 200, 210, 220, 300, 310, 320. Each sensor in a pair senses either a respective x or y component of the magnetic field emanating from the overhead phase conductors. The sensors are positioned remotely from the phase conductors and therefore do not interfere with the transmission system. The magnetic field components emanating from the lines induce respective open circuit voltages on each sensor, which serve as inputs to a larger computerized system for calculating other parameters of interest in the model.

Each sensor (e.g., 10) in the system is an apparatus capable of measuring the three-dimensional phase and magnitude of the magnetic field emanating from a phase conductor. The sensor 10 has at least one pair of parallel conductive windings 21-23, 22-24 of opposite polarity from a common ground. The opposite polarity windings substantially cancel the electric field signal on the windings and generate an open circuit voltage between the ungrounded ends of each winding. The result is that two good magnetic field signals from the coils are positive and negative mirror images of each other. The electric field signal is the same on the two leads from the coils. By using a differential input device in the electronics, the electric field is rejected as a common mode signal, and the differential mode magnetic field signal is kept.

In one embodiment the windings 21-23, 22-24 have an enclosed area of at least 150 turn-meters-squared. The windings are wrapped around a substantially cylindrical bobbin such that each winding is separately turned about respective side-by-side cross-sectional thicknesses of the bobbin. In a preferred embodiment, the windings are of the same material, link, and turn radius. The bobbin includes a core that may be made of a ferrite material, an alloy of nickel and iron, or met-glass.

The voltage induced on each sensor is related to its position relative to the overhead phase conductors, the number of loops or turns in the sensor coils, and the rate of change of the magnetic field from the phase conductors. One should keep in mind that the coils are sensitive to the time derivative of the magnetic field signal. A consequence of this is that the coils are twice as sensitive to the second harmonic of a fundamental frequency (e.g., 60 Hz fundamental in the instant case). The coils are three times as sensitive to the third harmonic and so on. In one embodiment, the sensor is sufficiently close to an overhead phase conductor such that the open circuit voltage between the windings is at least 100 mV AC. In a more preferred embodiment, the open circuit voltages are between about 100 and about 400 mV AC.

It is desirable to operate the system within a frequency range that avoids the resonant frequency of the coils, or windings, within each sensor 10. For this reason, the coils are configured to have the resonant frequency centered at 4 kHz or higher. With a fundamental frequency of interest at about 60 Hz, the system according to this invention operates well below the resonant frequency of the coils for a more controlled and stable response. The coils within the sensors of this invention are designed so that the inter-winding capacitance is extremely low (approximately 0.5 nF), and this low capacitance pushes the resonant frequency out to the desired range of 4 kHz or higher.

One should note that the output of the sensor 10 depends upon the load on the coils within that sensor 10, as determined by the input electronics. If the load is "high impedance" then almost no current comes out of the coil, and the measured output is voltage. If the load is "low impedance," then significant current will come out of the coil. The possibility exists, therefore, that a low impedance system based on induced current measurements from the sensors could be used to calculate the desired values for the overhead transmission and distribution system.

As noted above, the sensors work in pairs and are positioned orthogonally without intersecting so as to sense only the x and y components of the AC magnetic fields produced by a phase conductor. A vertically positioned sensor (e.g., 12) has a horizontal axis and provides a measurable voltage induced by the x-component of the magnetic field. A horizontally positioned sensor (e.g., 10) has a vertical axis and provides a measurable voltage induced by the y-component of the magnetic field. As shown in FIG. 1, a most preferred embodiment utilizes three pairs of orthogonally oriented sensors 10, 12, 14, 16, 18, 20 positioned on the ground under three overhead phase conductors.

Figure 4:
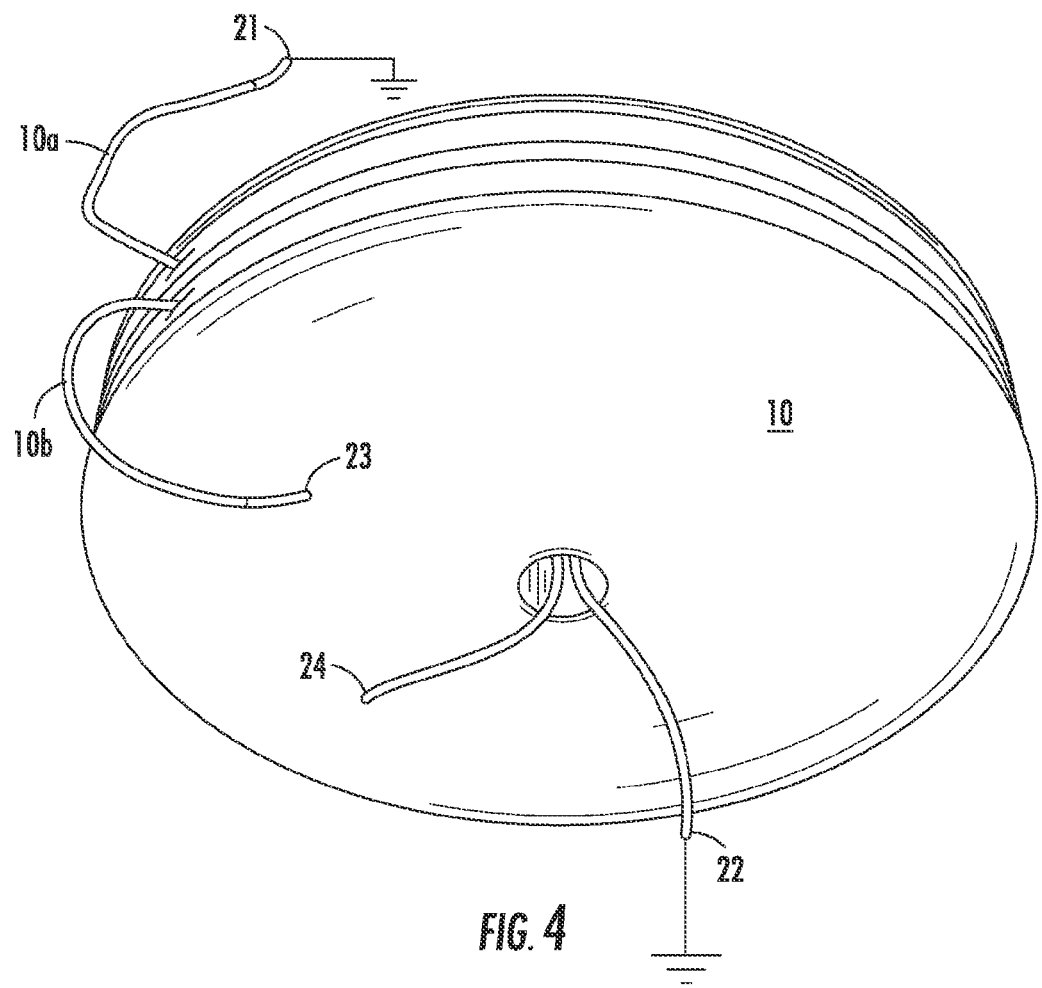
FIG. 4 depicts an electric field canceling, magnetic field sensor having two opposite polarity coils.
Figure 5:
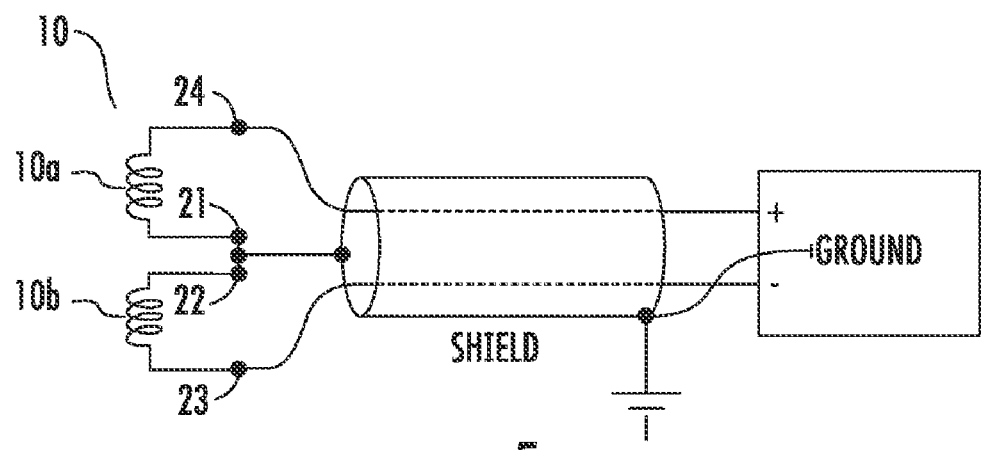
FIG. 5 schematically depicts the coil wiring of the sensors in FIG. 4.

FIGS. 4 and 5 show further details of a sensor used according to this invention. Sensor 10 has two windings 10a, 10b side-by-side in a cross-sectional thickness of the sensor. A first winding 10a starts at end 22 closest to the sensor core and wraps around the core circumference for the desired number of turns, thereby ending at loose end 23 along the outer circumference of the sensor. A second winding starts at end 24 closest to the sensor core and wraps around the core circumference for the desired number of turns, ending at loose end 21 along the outer circumference of the sensor 10. As shown in FIG. 5, the first (core) end 22 of the second winding 10b and the loose end 21 of the first winding 10a are connected to a common ground. A differential voltage measurement is then available between the windings from the loose end 23 of the second winding 10b and the first (core) end 24 of the first winding 10a.

One useful aspect of taking the differential voltage measurement in this way is that the opposite polarity windings 10a and 10b cancel out the electric fields generated on the windings. The electric field is not necessary for the system of this invention and only distorts the desired voltage measurements. By canceling the electric fields generated on the windings 10a and 10b, the system of the present invention provides more accurate voltage measurements related only to the magnetic field emanating from the overhead phase conductors.

Continuing with the disclosure of FIG. 1, the open circuit voltages from the sensors are differential inputs to a respective low pass filter for each sensor. This filtering removes the higher harmonics and provides only the data of interest to the next step in the process. In accordance with standard design considerations, the low pass filter may be an RC low pass filter, and in particular, may be a low pass filter with a cut-off frequency of about 98 Hz.

The analog voltage measurements are then sampled by an analog to digital converter 25 (ADC) to digitize the data processing. In one embodiment, the ADC has eight channels and samples the voltage signals at 8000 samples per second to produce a 16 bit number representing each real time voltage measured across the pairs of windings on each sensor. By incorporating an oscillator into the hardware design, the invention improves the ADC 25 performance and provides a convenient means of calculating the frequency of the voltage signals.

The voltages, of course, are induced across the windings of each sensor in response to the magnetic field from the phase conductors in the overhead transmission and distribution system. The numbers representing the voltages in digital format are fed to a computer processor 35 for analysis according to this invention. The digitally represented voltage signals provide the foundation for the system's ability to determine the magnitude of the current on each overhead phase conductor, the phases and frequencies of those currents, the height, sag, and clearance of each phase conductor, the capacity and ampacity of each conductor, and the temperature of the lines.

In order to provide calibration tools, sensor data, and a general check on the system, FIG. 1 shows a laser range finder for manually measuring the height of the conductors from the sensor and for determining the sensors' geographical positions. The invention encompasses the possibility, however, of using a pre-populated database to account for this information. All of the data from the field measurements may be transmitted via a traditional or a wireless network (e.g., the internet) to other computers and other data processing centers located remotely from the point of data collection. Finally, FIG. 1 also shows the battery back-up and the solar powered panel that allows field installation without connecting to a separate power source.

The system further includes a data processing module implemented in software for processing the digital data that represents real time voltage signal outputs from the sensors. The data processing module is split into two executables. The first executable completes data acquisition in real time. The second executable completes the analysis in either real time or off line.

The data acquisition module within the data processing system includes a digital band pass filter to isolate the fundamental frequency of the data stream representing each real time voltage signal. The data acquisition module may be further divided into a phase determination module for identifying the phase of each voltage signal and an amplitude determination module for identifying the amplitude of each voltage signal. Each of these modules is discussed in more detail below.

In one embodiment of the invention, the phase determination module calculates an inner product of the vector (i.e., linear array) of data samples and a vector containing a 60 Hz sine wave to get a value Q. The module further calculates an inner product of the data samples and a vector containing a 60 Hz Cosine to get a value I. Finally, the value of arctan(Q/I) yields the phase of the data. "I" means "in-phase" and "Q" means "quadrature". This is also known as the "dot product" of the two vectors. The phases are optionally adjusted by coil phase offsets.

The invention may also include an amplitude determination module that includes a means of calculating the root mean square volts for each channel within the analog to digital converter 25. The amplitudes are scaled by the measured coil sensitivities, so that the data are now in units of volts per turn-meter-squared. Hence, if coil X saw 1 volt, and if it had 1000 turn-meter-squared, then the new value would 0.001. This step allows easier comparison with simulation results. Next, the amplitude and phase data are smoothed (low pass filtered) by a finite response filter.

A more detailed example of the data processing module includes the analog to digital converters (ADCs) collecting voltage readings at 8000 readings per second for 4 seconds. These 32,000 numbers per ADC are sent out to a computer processor 35 after a 1 second delay, so the computer receives 256,000 numbers every 5 seconds. In a preferred embodiment, each of the six sensors in the system sends data to one of the 8 channels in the analog to digital converter. The seventh channel is used for synchronization, and the eighth channel is a spare.

The signals from the ADCs contain the desired 60 Hz sine/cosine but they also include the higher harmonics that must be filtered out for the software to work properly. To do that, the software filters away any signals above 72 Hz and below 48 Hz. This is done by "convolving" the 32000 numbers with a "filter kernel," which is a list of 2001 numbers. Convolution is a way of taking two lists of numbers (two arrays) and forming a list of weighted averages from them. Because the filter kernel is constructed as prescribed by known standards, the weighted average keeps signals that are between 48 and 72 Hz. The cleaned-up list of numbers is shorter than the original list so now the signal is only 29999 samples long, which is more than sufficient for purposes herein.

Although to get the phase one could check when the ADC voltages go through zero, a more accurate way to do it is as follows:

1. "Window" the previously filtered ADC signals. That is, if the ADC signal is 29999 numbers long, make another list of numbers, also 29999 long, that starts at zero, gradually builds up, then gradually goes back to zero. Then multiply each ADC number by the corresponding number in the list. That makes the ADC signal become zero at the start, gradually build up, so it looks like a sine wave, then gradually fall-off and go to zero by the last, 29999th number. In one embodiment, the window function is the "Blackman" window. The Blackman window prevents the sudden and abrupt changes in data (i.e., going from zero to a higher value immediately) that causes errors in later portions of the system.
2. Make a perfect 60 Hz sine wave in computer memory. This is the "model sine", and like the ADC values, it is 29999 numbers long.
3. Make a perfect 60 Hz cosine wave, 29999 numbers, which is 90 degrees ahead of the sine wave.
4. Multiply each number of the model sine wave with the corresponding ADC number, and add all those products up. This is called the "I" or "in-phase" component.
5. Similarly, multiply each number of the model cosine wave with the corresponding ADC number, and add all those products up. This is called the "Q" or "quadrature phase" component.
6. At this point, one could take the arctangent of I divided by Q. This would give us the phase of the signal, in radians. However since Q can be zero, and division by zero causes software problems, the better method uses a special purpose routine that is readily available as "atan2". This routine takes I and Q and computes the angle without the problem of dividing by zero. The angle comes out in radians, but can be converted to degrees.

To calculate the signal amplitude, one starts with the output of the "windowing" of step 1 in finding the phase. With the list of 29999 numbers, calculate the root-mean-square (RMS) of the list, (i.e., square each number, add all the squares, divide by 29999, and take the square root). Then multiply by a correction factor to account for the fact that the Blackman window removed some signal at the start and end. This is the ADC signal amplitude that we need. The units are volts RMS.

Another detail is that to save processor resources, one can make various optimizations to the fitter. One optimization is that rather than fit three individual cable currents, the software actually fits the ratio of the currents on the outside phase conductors 210, 220, 310, 320. To be consistent, the coil amplitudes portion of "Q" is then based on the ratio of the coil amplitudes. The effect is to reduce the number of knowns and unknowns by one.

Similarly, rather than fit three cable phases, the system fits the phase difference of the currents on the outer phase conductors 210 and 220 compared to the current on the middle conductor 200. This reduces the number of knowns and unknowns by one. Hence, the software actually works with 5 unknowns and 6 knowns.

Overall, the invention enables a computerized method of remotely measuring the physical height of at least three phase conductors in a power transmission and distribution system in addition to the magnitude and phase of the currents on the phase conductor. The method includes the steps of positioning an orthogonally-oriented pair of electric field canceling magnetic field sensors under each conductor such that the magnetic field of a phase conductor generates an open circuit voltage between the respective ends of coils in the sensors. Next, the method provides for measuring the open circuit voltages on each sensor and operating software on a computer processor to determine the height, magnitude, and phase parameters of the system.

Figure 11:
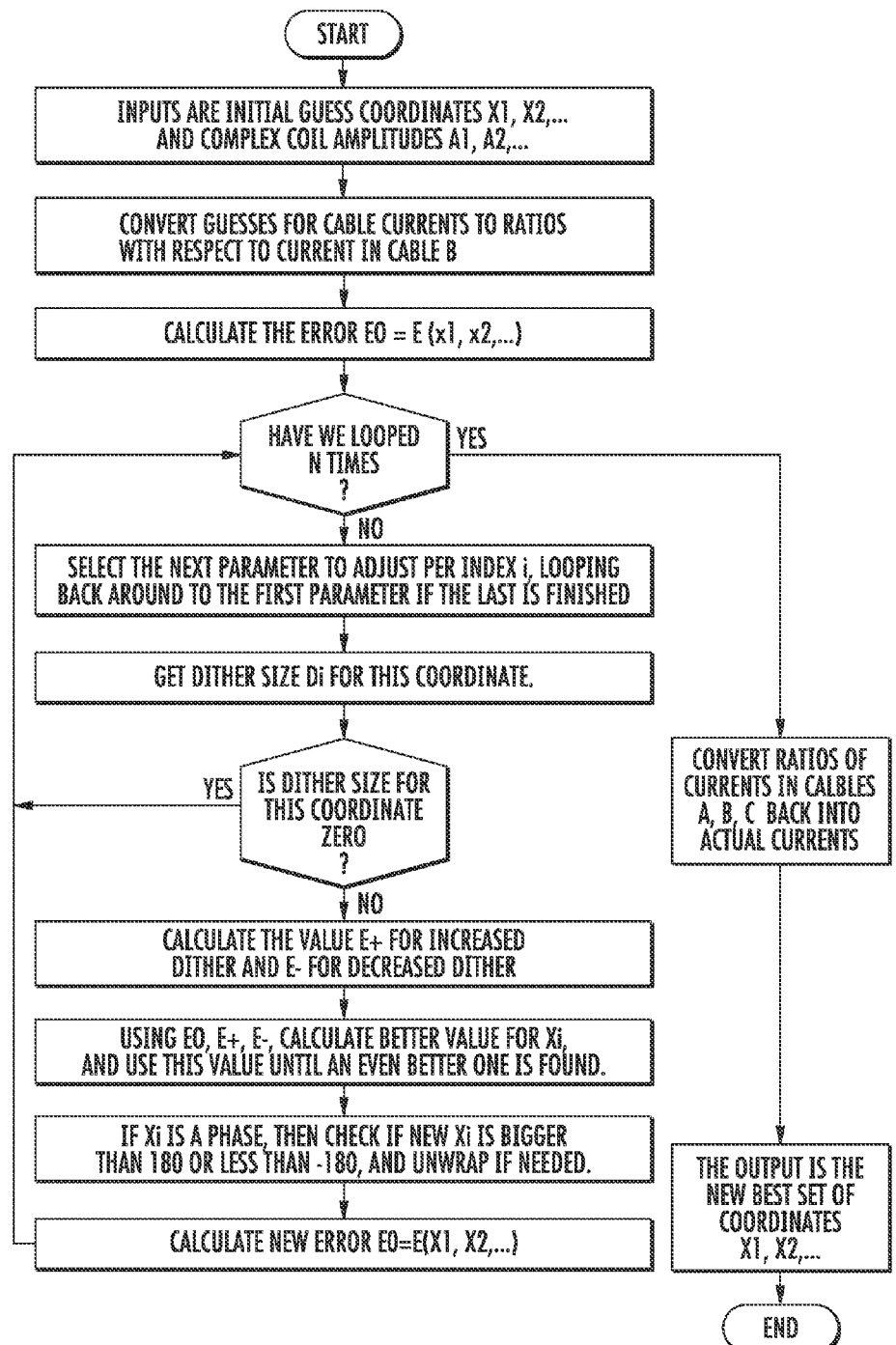
FIG. 11 is a schematic of the computer logic used in one embodiment of the data fitter for calculating the overhead transmission system parameters from measured sensor voltages.

The software of this invention uses fitter technology to calculate the parameters of interest from the voltages induced on the sensors. The fitting has two parts: a magnetic field simulation and an iterative routine that tries to make the fitting match the measurements. One example of the fitting routine is shown in FIG. 11. The field simulation has the following inputs, which initially are all guesses:

The cable heights. All are assumed to be equal.
The three individual cable currents, in RMS amps.
The three individual cable phases, in degrees.

In addition, the simulation needs to know the left-right and up-down positions of the four coils, and their orientations. The laser range finder can be used to gather this data.

From the data, the simulation predicts what the coils' outputs should be: the four coil amplitudes (volts per turn-meter-squared) and phases (degrees). In one embodiment, the fitting routine performs the following steps:

1. It provides the simulation with guesses for the 7 unknown values listed above.
2. It compares the four coil phases and four coil amplitudes (8 known values) predicted by the simulation against the measured values to calculate the error value.
3. The fitter varies the 7 unknowns, and tries again. If the error improves, it keeps the better value.
4. This continues for some reasonable number of iterations. The best fits make up the answer set including the cable height, currents and phases. As can be readily recognized, the system computes 7 unknowns from 8 measurements. Hence in theory the problem is over-determined.

In a more preferred embodiment, the fitter steps include assigning initial estimates for the system parameters, the parameters including the height of each phase conductor, the current on the phase conductors and the phases of those currents, and determining the actual values for the heights of the phase conductors, the currents on the phase conductors, and the phases of the currents by operating an iterative calculation loop within the computer software. The iterative calculation loop includes the steps of:

(i) calculating the expected value of the respective complex open circuit voltages on the sensors that should result from the assigned initial estimates for each phase conductor height, current, and phase;

(ii) calculating the error between the measured open circuit voltages on each sensor and the expected open circuit voltages on each sensor;

(iii) assigning a new estimate to at least one of the phase conductor heights, currents, and phases;

(iv) iteratively calculating steps (i), (ii), and (iii) via the computer processor to minimize the error between the expected complex open circuit voltages and the measured complex open circuit voltages on each sensor; and (v) determining the actual set of values for the height of each phase conductor, the magnitude of the current on each phase conductor, and the phase of the current on each phase conductor from the iteratively determined values that minimized the error for all of the system parameters.

The step of assigning initial values includes assigning initial values for the height, current, and phase of each of the three phase conductors, and the step of calculating the predicted voltage on each respective coil includes calculating the magnetic field sensed by each coil from each of the three phase conductors. The step of assigning a new initial estimate for the height, current, and phase on a phase conductor comprises evaluating whether the error value increases or decreases when the estimate is increased or decreased by a known amount referred to as the dither value for that parameter.

In another embodiment, the invention is characterized as a computerized method of remotely measuring the physical parameters associated with a power transmission and distribution system, the parameters including the physical height of at least three phase conductors in a power transmission and distribution system, and the magnitude and phase of the current on each phase conductor. The method according to this invention includes positioning at least three orthogonally-oriented pairs of electric field canceling magnetic field sensors such that the magnetic field of each phase conductor generates an open circuit voltage between the respective ends of coils in the sensors, measuring the open circuit voltages on each sensor, and operating computer-controlling software commands via a computer processor to determine the real time values of the system parameters.

The software may include commands implementing the following steps:

(i) assigning initial estimates for the unknown system parameters for each of the three phase conductors, the system parameters including the respective height of each phase conductor, the magnitude of the current on a respective phase conductor, and the phase of respective current;

(ii) calculating the expected value of the respective complex open circuit voltages on each sensor resulting from the assigned initial estimates for the system parameters;

(iii) calculating the error $E0$ between the measured open circuit voltages on each sensor and the predicted open circuit voltages on each sensor, and (iv) calculating the actual values of the system parameters via the by operating an iterative calculation loop for each sensor.

In a preferred embodiment of the software, the iterative calculation loop includes:

(i) selecting a system parameter for adjustment;

(ii) incrementing the selected system parameter by a dither value;

(iii) calculating the predicted value of the respective complex open circuit voltages on the sensor that should result from the increased system parameter in conjunction with the assigned initial estimates for the remaining parameters;

(iv) calculating the error $E+$ between the measured open circuit voltages on the sensor and the predicted open circuit voltages on the sensor;

(v) decrementing the selected system parameter by the dither value;

(vi) calculating the predicted value of the respective complex open circuit voltages on the sensor that should result from the decreased system parameter in conjunction with the assigned initial estimates for the remaining parameters;

(vii) calculating the error $E-$ between the measured open circuit voltage on the sensor and the predicted open circuit voltage on the sensor;

(viii) storing the value of the selected parameter that minimizes the error value;

(ix) selecting the next system parameter for adjustment such that the system parameters are repetitively selected;

(x) iteratively calculating steps (ii)-(ix) to determine which set of system parameter values minimize the error values between the predicted complex open circuit voltages on the sensors and the measured complex open circuit voltages on the sensors. The computerized method runs the iterative calculation loop for each sensor simultaneously.

As noted in previously described embodiments above, the method includes the step of digitally sampling the open circuit voltages on each sensor, (e.g., at 8000 samples per second) and determining the frequency of the current on each phase conductor by comparing the actual system parameters to an oscillator. In calculating the expected value for the open circuit voltages, the method and system herein calculate the magnetic flux density in which each sensor would operate for a given set of system parameters. In regard to step (viii) of the iterative calculation loop above, the step of calculating the value for the selected parameter that minimizes the error value, the preferred method subtracts a ratio of differential equations from the selected system parameter value. More specifically, the differential ratio is determined by calculating the first derivative of the system error function divided by the second derivative of the system error function. This useful computation was first realized due to the fact that the error function used in this method is a quadratic equation.

A more detailed narrative of the fitter steps is helpful in understanding the invention. When the fitter is called the first time, some initial guess as to "the answer" has to be provided. The guess could be that the cable height is 18 meters, the currents on the cables are all 100 Amps, and the phases are +120, 0, −120. The phases could also be flipped to −120, 0, and +120. The next step is calculating a number referred to as "the error", or "E" for short. If the guess is exactly correct, the error is as small as possible and close to zero. Technically, this is called "minimizing the error." For purposes herein, the term "minimizing" is used in the sense of forcing the error value as close as possible to zero. It is impossible for the error to ever be exactly zero, because, as explained later, the error is a sum of squares of individual errors, and the squaring function makes all the pieces of the error be positive, and the pieces will always have at least some error because of noise sources such as the ADC, and external interference. In any event, the more a parameter guess is wrong, the larger a number E is.

At this point, the calculation is traditional logic loop. As the software iteratively loops, it works its way through the list of adjustable parameters. These are the phase conductor heights (assumed to be all the same), the conductor currents and phases. For each of these parameters, there is a list of dither sizes, Di, which are small changes in height (1 cm), small changes in current (1% change), and small changes in phase (0.01 degree). If a dither size is zero, then that signal is not adjusted for this parameter, and the loop does nothing. This is convenient because the phase of the middle cable is always zero, and so it does not need to be adjusted.

To start, refer to the error already computed as $E_0$. The software adjusts the currently evaluated parameter and decreases it by the dither size associated with that parameter. Next, the software computes the error for that adjusted parameter value and names that value E−. The software also goes in the opposite direction by increasing the parameter by a dither size and computing the error E+. Using $E_0$, E− and E+, the software calculates a new, better value for that parameter. The formula for getting the new value Xi is:

New $Xi=Xi−(E'/E'')$, when E' is the first derivative and E'' is the 2nd derivative of E(Xi).

$E'=(E+−(E−))/(2Di)$, again where Di is the dither size $E''=((E+)+(E−)−(2E0))/(Di^2)$ The system now has a new Xi but in the case of phases, the new Xi might be outside of the "legal"−180 to +180 degree range. If that is the case, then the software either adds or subtracts 360 degrees to "wrap" it back into the range. The new Xi is used to calculate a new error E0, and the loop continues until the error is within a defined tolerance.

If the data analysis uses the above described step of optimizing resources with current ratios and phase differences, the next step is converting the ratios of the currents in the cables to actual currents. To do that, the system takes the voltage from one of the coils (e.g., the Bx coil) and divides it by what the fitter results would make that current be. That ratio will be a large number, which is multiplied by the currents in the cables to get the actual currents in the cables.

From yet another perspective, the error signal is basically a comparison of the complex voltages from the coils with complex voltages from a program called "waveform predictor" that "predicts" what the coils would see based on the guesses for the parameters, referred to generally as Xi. If the predicted coil voltages exactly match the measured voltages, then the error is zero. The value of E (where D is used for delta) is:

$E=(Dv1^2+Dv2^2+ \ldots +Dv6^2)Wv+(Dp1^2+Dp2^2+ \ldots +Dp6^2)Wp$ where $Dvi=(Vmi/VmBY)−(Vpi/VpBY)$ (this is the error from a coil's voltage)

and $Dpi=(Pmi−PmBY)−(Ppi−PpBY)$ (This is the error from a coil's phase)

The meaning of the "i" subscripts is the coil number, which can run from 0 to 5 (because there are 6 coils).

The "m"s mean "measured" and the "p"s mean "predicted".

The "W"s are "weights", which are used to adjust how sensitive we are to the voltages or phases. (e.g., Wv=1.0 and Wp=$10^{-5}$.)

In other words, the error's first part is the sum of the squares of the differences of the ratios of coil voltages that are measured versus those predicted. The ratio for coil i is the voltage from coil i divided by the voltage from the $B_Y$ coil, which is the coil under the center conductor that feels the vertical component of the magnetic field. The error's second part is the sum of the squares of the differences between the measured relative phases and predicted relative phases. Relative means the phase from the $B_Y$ coil, which means subtracting the phase of $B_Y$ from the phase of coil i. Add the two parts, and that sum is the error that the fitter uses.

Predicting coil voltages is the job of "waveform predictor". The waveform predictor takes as inputs the locations in space of the cables and the coils. (The cable's location can change as it goes up or down.) It also uses the coil orientations and the cable orientations. It uses the guesses as to what the currents are in the cables and the phases. The process used in programming the waveform predictor is a conventional application of electromagnetic theory (Maxwell's equations), which is summarized, in part below.

The B-field at any observation location is the sum of the fields produced by each phase conductor.

$$B_x(x_o, y_o) = -\frac{\mu_o}{2\pi}\sum_{i=A}^{C} I_i\left[\frac{(y_o - y_i)}{(x_o - x_i)^2 + (y_o - y_i)^2}\right] (T)$$

$$B_y(x_o, y_o) = \frac{\mu_o}{2\pi}\sum_{i=A}^{C} I_i\left[\frac{(x_o - x_i)}{(x_o - x_i)^2 + (y_o - y_i)^2}\right] (T). \text{ where}$$

$\mu_o=4\pi\times10^{-7}$ (H/m). In these equations, $x_i$ and $y_i$ represent the x and y coordinates of the phase conductors.

Equations 1a and 1b are derived from magneto-static considerations. However, it can be shown that for sufficiently low frequencies (in the kHz range) or for sufficiently slowly varying transient signals (like the 60 Hz power line currents), the static representations are still valid. Thus, for phase conductor currents that are time varying, the transient B-field response at $(x_o, y_o)$ is written as $$B_x(t; x_o, y_o) = -\frac{\mu_o}{2\pi}\sum_{i=A}^{C} I_i(t)\left[\frac{(y_o - y_i)}{(x_o - x_i)^2 + (y_o - y_i)^2}\right] (T)$$

$$B_y(t; x_o, y_o) = \frac{\mu_o}{2\pi}\sum_{i=A}^{C} I_i(t)\left[\frac{(x_o - x_i)}{(x_o - x_i)^2 + (y_o - y_i)^2}\right] (T).$$

The magnetic field sensors have responses that are proportional to frequency in the spectral domain $V(f)=-j2\pi f A_{eq}B(f),$ where $A_{eq}$ is the equivalent area of the sensor. In the time domain, this is a derivative relationship as $$V(t) = -A_{eq}\frac{d}{dt}B(t).$$

As a consequence, the measured sensor voltages in the time domain can be expressed in terms of the currents on the conductors as $$V_x(t; x_o, y_o) = \frac{\mu_o}{2\pi} A_{eq} \sum_{i=A}^{C} \frac{dI_i(t)}{dt} \left[ \frac{(y_o - y_i)}{(x_o - x_i)^2 + (y_o - y_i)^2} \right] (T)$$

$$V_y(t; x_o, y_o) = -\frac{\mu_o}{2\pi} A_{eq} \sum_{i=A}^{C} \frac{dI_i(t)}{dt} \left[ \frac{(x_o - x_i)}{(x_o - x_i)^2 + (y_o - y_i)^2} \right] (T).$$

These relationships, and other similar techniques, are programmed into the waveform predictor for use in a preferred embodiment of the invention.

Figure 9:
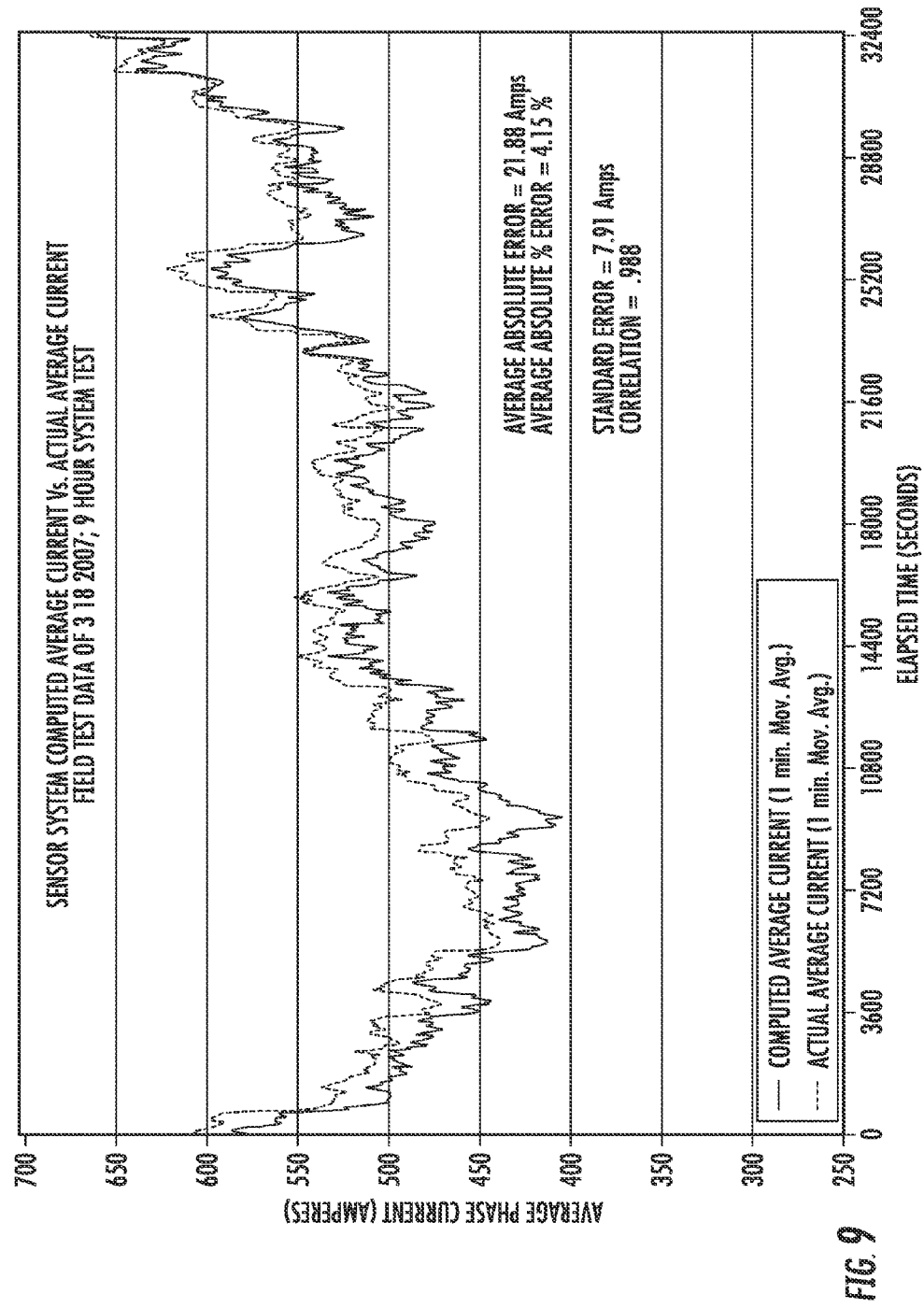
FIG. 9 is a plot of the sensor system computed average current in comparison to the known values.

The invention has been tested in live field tests with consistently excellent results. FIGS. 9 and 10 show the computed system parameters versus known values for actual phase conductors in operation for a live overhead power transmission and distribution system. The computed values, which resulted from the technology disclosed and claimed herein, track known values to a highly acceptable degree of accuracy.

In the specification and the figures, typical embodiments of the invention have been disclosed. The present invention is not limited to such exemplary embodiments. Specific terms have been used only in a generic and descriptive sense, and not for purposes of limitation. The scope of the invention is set forth in the following claims.

1 Mamishev, A., Nevels, R., Russell, D., "Effects of Conductor Sag or Spatial Distribution of Power Line Magnetic Fields," IEEE Trans. on Power Delivery, V. 11, No. 3, July 1996
2 Bush, R., Black, W., et al, "Experimental Verification of a RT Program for the Determination of Temperature and Sag of OH Lines," IEEE Trans. Power App. & Systems, V. PAS102, No. 7., July 1983
3 Seppa, T. O., "Temperature-Sag Model for Operational Real Time Ratings," IEEE Trans. on Pwr. Delivery, V. 10, No. 3, July 1995
4 Chen, S., Black, W., "High Temp. Sag Model for OH Conductors," IEEE Trans. Pwr. Del., V. 18, No. 1, January 2003
5 Personal Communication, Whisonant, L., Duke Power, November 2004
6 Personal Communication, Roach, A., Reliant Energy, April 1999
7 Plonsey, R. and R. E. Collin, Principles and Applications of Electromagnetic Fields, McGraw-Hill, New York, 1961.
8. J. R. Wait and K. P. Spies, "On the Image Representation of the Quasi-Static Fields of a Line Current Source above the Ground", *Canadian Journal of Physics*, Vol. 47, 1969, pp. 2731-2733.
9. Robert G. Olsen, "Electromagnetic Fields from Power Lines," Washington State University, Pullman, Wash. 99164-2752, 1993, IEEE Power Conference Proceedings.

The invention claimed is:

1. An apparatus that measures the three dimensional phase and magnitude of the magnetic field emanating from overhead transmission and distribution phase conductors, comprising:
at least one magnetic field sensor positioned remotely from the phase conductor, said sensor comprising:
at least a pair of conductive windings having opposite polarity from a common ground, said opposite polarity windings canceling the electric field signal on said windings and generating an open circuit voltage between the ungrounded ends of each winding; and
a cylindrical bobbin, wherein said windings are separately turned about respective side-by-side cross sectional thicknesses of said bobbin.

2. An apparatus according to claim 1, wherein said windings comprise an enclosed area of at least 150 turn-meters squared.

3. An apparatus according to claim 1, wherein said windings are of the same material, length, and turn-radius.

4. An apparatus according to claim 1, wherein said bobbin comprises a core selected from the group consisting of a hollow core, an air-filled core, a ferrite core, a core made of an alloy of nickel and iron, and a met-glass core.

5. An apparatus according to claim 1, comprising at least three pairs of said magnetic field sensors for positioning below an overhead power transmission line, wherein each pair of sensors is positioned under one phase conductor in a three-phase transmission system.

6. An apparatus according to claim 1, wherein said sensor is positioned proximate to said phase conductor such that said open circuit voltage between windings is at least 100 millivolt AC.

7. An apparatus according to claim 6, wherein said open circuit voltage is between 100 and 400 millivolt AC.

8. An apparatus according to claim 1, comprising at least one pair of said magnetic field sensors, wherein said pair of sensors is positioned orthogonally without intersecting so as to sense only the X and Y components of the AC magnetic fields produced by the phase conductor.

9. An apparatus according to claim 8, wherein said open circuit voltage on a respective sensor represents the X or Y component of the magnetic field produced by at least one overhead conductor.

10. An apparatus that measures the phase and magnitude of the magnetic field emanating from overhead transmission and distribution phase conductors, comprising:
at least one pair of magnetic field sensors positioned remotely from a phase conductor, wherein said pair of magnetic field sensors is positioned orthogonally without intersecting so as to sense the X and Y components of the magnetic field produced by the phase conductor, and wherein each of said sensors comprises at least a pair of conductive windings having opposite polarity from a common ground, said opposite polarity windings canceling the electric field signal on said windings and generating an open circuit voltage between the ungrounded ends of each winding.

11. An apparatus according to claim 10, wherein said windings comprise an enclosed area of at least 150 turn-meters squared.

12. An apparatus according to claim 10, wherein at least one of said sensors further comprises a cylindrical bobbin, wherein respective windings of said at least one of said sensors are separately turned about respective side-by-side cross sectional thicknesses of said bobbin.

13. An apparatus according to claim 12, wherein said bobbin comprises a core selected from the group consisting of a hollow core, an air-filled core, a ferrite core, a core made of an alloy of nickel and iron, and a met-glass core.

14. An apparatus according to claim 12, wherein said windings are of the same material, length, and turn-radius.

15. An apparatus according to claim 10, comprising at least three pairs of said magnetic field sensors for positioning below an overhead power transmission line, wherein each pair of sensors is positioned under one phase conductor in a three-phase transmission system.

16. An apparatus according to claim 10, wherein said sensor is positioned proximate to said phase conductor such that said open circuit voltage between windings is at least 100 millivolt AC.

17. An apparatus according to claim 16 wherein said open circuit voltage is between 100 and 400 millivolt AC.

18. An apparatus according to claim 10, wherein said open circuit voltage on a respective sensor represents the X or Y component of the magnetic field produced by at least one overhead conductor.

19. An apparatus that measures the phase and magnitude of the magnetic field emanating from overhead transmission and distribution phase conductors, comprising:
  at least one magnetic field sensor for positioning remotely from a phase conductor, said sensor comprising at least a pair of conductive windings having opposite polarity from a common ground, said opposite polarity windings substantially canceling the electric field signal on said windings and generating an open circuit voltage between the ungrounded ends of each winding, wherein said sensor is positioned sufficiently proximate to the phase conductor such that said open circuit voltage between windings is at least 100 millivolt AC.

20. An apparatus according to claim 19, wherein said open circuit voltage on a respective sensor represents the X or Y component of the magnetic field produced by at least one overhead conductor.

21. An apparatus according to claim 19, wherein said open circuit voltage is between 100 and 400 millivolt AC.

22. An apparatus according to claim 19, wherein said windings comprise an enclosed area of at least 150 turn-meters squared.

23. An apparatus according to claim 19, wherein said sensor further comprises a cylindrical bobbin, wherein respective windings of said sensor are separately turned about respective side-by-side cross sectional thicknesses of said bobbin.

24. An apparatus according to claim 23, wherein said bobbin comprises a core selected from the group consisting of a hollow core, an air-filled core, a ferrite core, a core made of an alloy of nickel and iron, and a met-glass core.

25. An apparatus according to claim 23, wherein said windings are of the same material, length, and turn-radius.

26. An apparatus according to claim 19, comprising at least three pairs of said magnetic field sensors for positioning below an overhead power transmission line, wherein each pair of sensors is positioned under one phase conductor in a three-phase transmission system.

27. An apparatus according to claim 19, comprising at least one pair of said magnetic field sensors, wherein said pair of sensors is positioned orthogonally without intersecting so as to sense only the X and Y components of the AC magnetic fields produced by the phase conductor.

* * * * *